United States Patent
Kim et al.

(10) Patent No.: US 7,230,862 B2
(45) Date of Patent: Jun. 12, 2007

(54) SEMICONDUCTOR MEMORY DEVICES AND METHODS OF DELAYING DATA SAMPLING SIGNAL

(75) Inventors: Sung-Hoon Kim, Seongnam-si (KR); Joung-Yeal Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 101 days.

(21) Appl. No.: 11/212,843

(22) Filed: Aug. 29, 2005

(65) Prior Publication Data

US 2006/0050573 A1    Mar. 9, 2006

(30) Foreign Application Priority Data

Sep. 3, 2004    (KR) ...................... 10-2004-0070178

(51) Int. Cl.
*G11C 7/00*    (2006.01)

(52) U.S. Cl. ............. 365/194; 365/230.02; 365/230.03

(58) Field of Classification Search ................ 365/194, 365/230.02, 230.03
See application file for complete search history.

(56) References Cited

U.S. PATENT DOCUMENTS

| | | | |
|---|---|---|---|
| 6,212,109 B1 * | 4/2001 | Proebsting | 365/190 |
| 6,314,029 B1 | 11/2001 | Ko et al. | |
| 6,359,826 B1 | 3/2002 | Kim | |
| 7,054,223 B2 * | 5/2006 | Takahashi et al. | 365/233 |

FOREIGN PATENT DOCUMENTS

| | | |
|---|---|---|
| JP | 2000-315389 | 11/2000 |
| KR | 1020010068104 | 7/2001 |

OTHER PUBLICATIONS

Korean Office Action dated Jan. 31, 2006 for Korean Application No. 10-2004-0070178.

* cited by examiner

*Primary Examiner*—Tuan T. Nguyen
(74) *Attorney, Agent, or Firm*—Harness, Dickey & Pierce, P.L.C.

(57) ABSTRACT

According to the example embodiments of semiconductor memory devices and the methods of delaying a sample data signal of the present invention, the delay characteristics of the data sampling signal (FRT) are adjusted based on the location of the memory unit in a row direction and/or in a column direction with respect to the input/output sense amplifier.

20 Claims, 18 Drawing Sheets

SEMICONDUCTOR MEMORY DEVICES AND METHODS OF DELAYING DATA SAMPLING SIGNAL

CLAIM OF PRIORITY

A claim of priority is made under 35 USC § 119 to Korean Patent Application No. 2004-70178, filed on Sep. 3, 2004, the contents of which are herein incorporated by reference in their entirety.

BACKGROUND OF THE INVENTION

1. Field of the Invention

Example embodiments of the present invention generally relate to semiconductor memory devices and methods of delaying a data sampling signal.

2. Description of the Related Art

FIG. 1 is a block diagram illustrating a conventional input/output sense amplifier, which may be used in a memory device.

Generally in a semiconductor memory device, a memory array is arranged in columns and rows. To read data stored in the memory array, a row address is input to select an entire row. Then a column address selects one bit out of the selected row. In response to a column selection signal (CSL), the selected data are transferred to data input/output lines (DIO). The data transferred to the data input/output lines (DIO) are sampled in response to a predetermined data sampling signal (FRT) by an input/output sense amplifier (IO S/A) 10. The sampled data, i.e., sensed data, are output through output lines (DO). The data sampling signal FRT, may be one of various control signals of input/output sense amplifier (IO S/A) 10 that allows the input/output sense amplifier to latch the sensed data.

FIG. 2 is a timing diagram illustrating delay characteristics of input data of the conventional memory device when there is a difference in distance between a plurality of memory blocks and a sense amplifier. FIG. 3 is a timing diagram illustrating delay characteristics of input data of the conventional memory device operating at high speed when there is a difference in distance between a plurality of memory blocks and a sense amplifier.

In general, as the density of a semiconductor memory device increases, a length of the data input/output line (DIO) used for data transfer also increases. Accordingly, time required to transfer data through the data input/output lines (DIO) may differ depending on the length of the DIO. In other words, if a memory block (A) is spatially farther away from an input/output sense amplifier (IO S/A) than a memory block (B), data (DATA_LONG) read from the memory block (A) is received by the input/output sense amplifier (IO S/A) relatively later than when data (DATA_SHORT) read from the memory block (B) is received by the input/output sense amplifier (IO S/A). Thus, the time required to transfer data from the memory block (A) to the input/output sense amplifier (IO S/A) and the time required to transfer data from the memory block (B) to the input/output sense amplifier (IO S/A) may be different. In addition, the time required to transfer data from the same memory block (A or B) to the input/output sense amplifier (IO S/A) may vary depending on the location of data addresses. Also, the data input/output lines (DIO) may have an influence on the time required to transfer data to the input/output sense amplifier (IO S/A).

Referring to FIG. 2, data (DATA_SHORT) from the memory block (B) is received by the input/output sense amplifier (IO S/A) relatively faster than data (DATA_LONG) read from the memory block (A). Even if DATA_SHORT and DATA_LONG are transferred through a data input/output lines (DIO) connected to the same column selection signal (CSL), the arrival time for each data at an input/output sense amplifier (IO S/A) varies depending on the row address of the memory cell data.

When the column selection signal (CSL) is enabled, the data sampling signal (FRT) is enabled after data from the corresponding memory block arrives at the input/output sense amplifier (IO S/A).

Generally, the data sampling signal (FRT) starts data sampling in synchronization with the last arrived data at the input/output sense amplifier (IO S/A), and terminates the data sampling in synchronization with the first arrived data at the input/output sense amplifier (IO S/A). Thus, as shown in FIG. 2, the sampling signal (FRT) has a sampling period WINDOW corresponding to an overlap between effective periods of the DATA_SHORT and the DATA_LONG.

However, the sampling period WINDOW grows shorter as the difference in the time interval of the memory blocks' (A and B) respective arrival at the input/output sense amplifier (IO S/A) becomes longer. As shown in FIG. 3, in some cases, there is a risk that the sampling period WINDOW of the data sampling signal (FRT) may not exist for a high-speed semiconductor memory device.

SUMMARY OF THE INVENTION

In an example embodiment of the present invention, a semiconductor memory device includes a plurality of memory units, a data input/output line to transmit data output from the plurality of memory units, an input/output sense amplifier configured to sense and amplify the data, and a delay control circuit adapted to delay a first data sampling signal by generating a second data sampling signal, the second data sampling signal generated based on distance information of each of the memory units with respect to the input/output sense amplifier and the first data sampling signal, wherein data from the plurality of memory units are sampled within an active period of the second data sampling signal.

In another embodiment of the present invention, a semiconductor memory device a plurality of memory units, a data input/output line to transmit data output from the plurality of memory units, an input/output sense amplifier configured to sense and amplify the data, and a delay control circuit adapted to delay a first data sampling signal by generating a second data sampling signal, the second data sampling signal generated based on a column address information and a row address information and the first data sampling signal, wherein data from the plurality of memory units are sampled within an active period of the second data sampling signal.

Also in another embodiment of the present invention, a method of delaying a data sampling signal of a semiconductor memory device includes activating a column selection signal to select a memory cell from a plurality of memory units, transmitting data of the selected memory cell through a data input/output line, delaying a first data sampling signal by generating a second data sampling signal based on distance information between each of the memory units with respect to the input/output sense amplifier, and sampling the data of the selected memory within an active period of the column selection signal and an active period of the second data sampling signal.

BRIEF DESCRIPTION OF THE DRAWINGS

The present invention will be better understood to those ordinary skill in the art with description of the example embodiments with reference to the attached drawings, wherein like elements are represented by like reference numerals, which are given by way of illustration only.

DESCRIPTION OF THE EXAMPLE EMBODIMENTS

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

Figure 1:
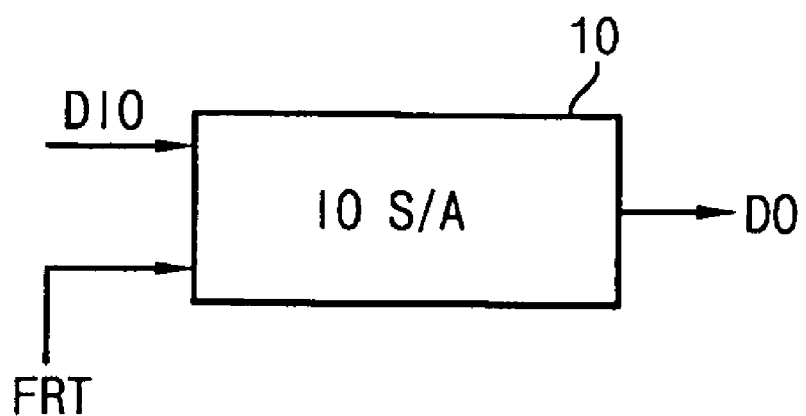
FIG. 1 is a block diagram illustrating a conventional input/output sense amplifier used in a memory device.
Figure 2:
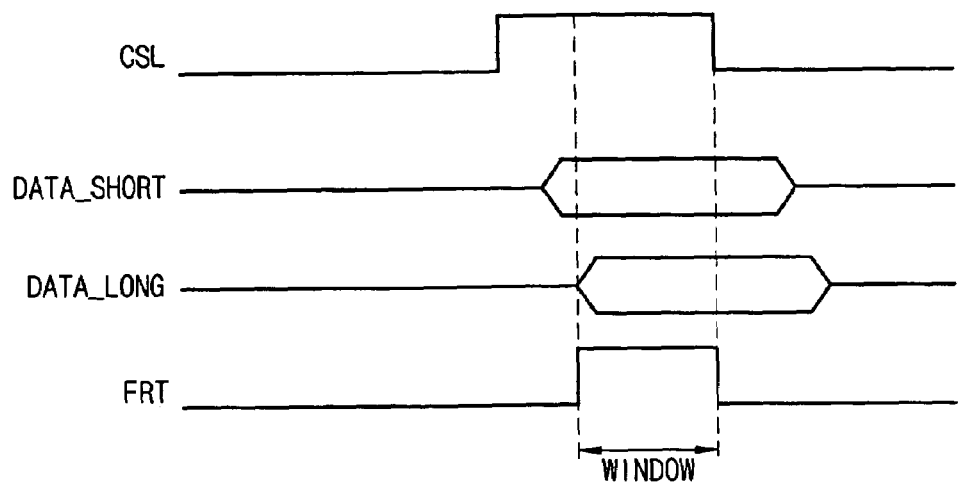
FIG. 2 is a timing diagram illustrating delay characteristics of input data of the conventional memory device when there is a difference in distance between each memory block with the sense amplifier.
Figure 3:
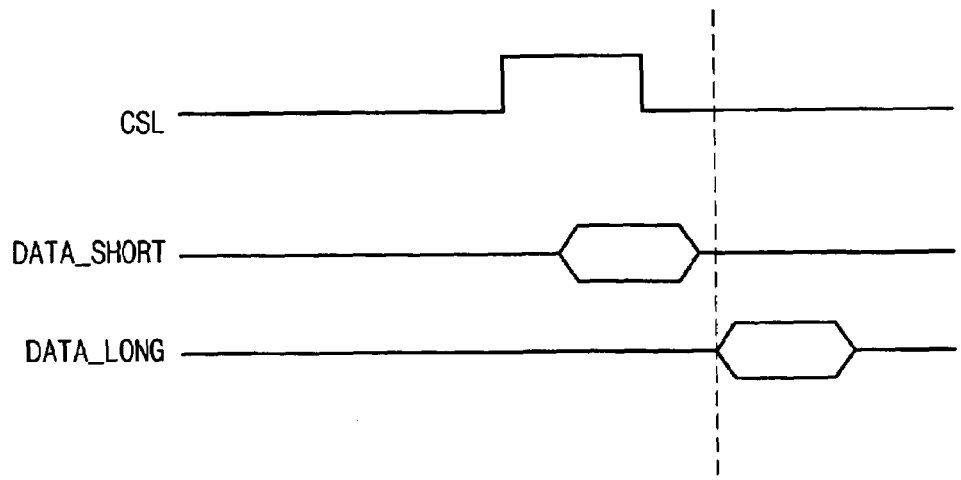
FIG. 3 is a timing diagram illustrating delay characteristics of input data of the conventional memory device when there is a difference in distance between each memory block operating at high speed with the sense amplifier.
Figure 4:
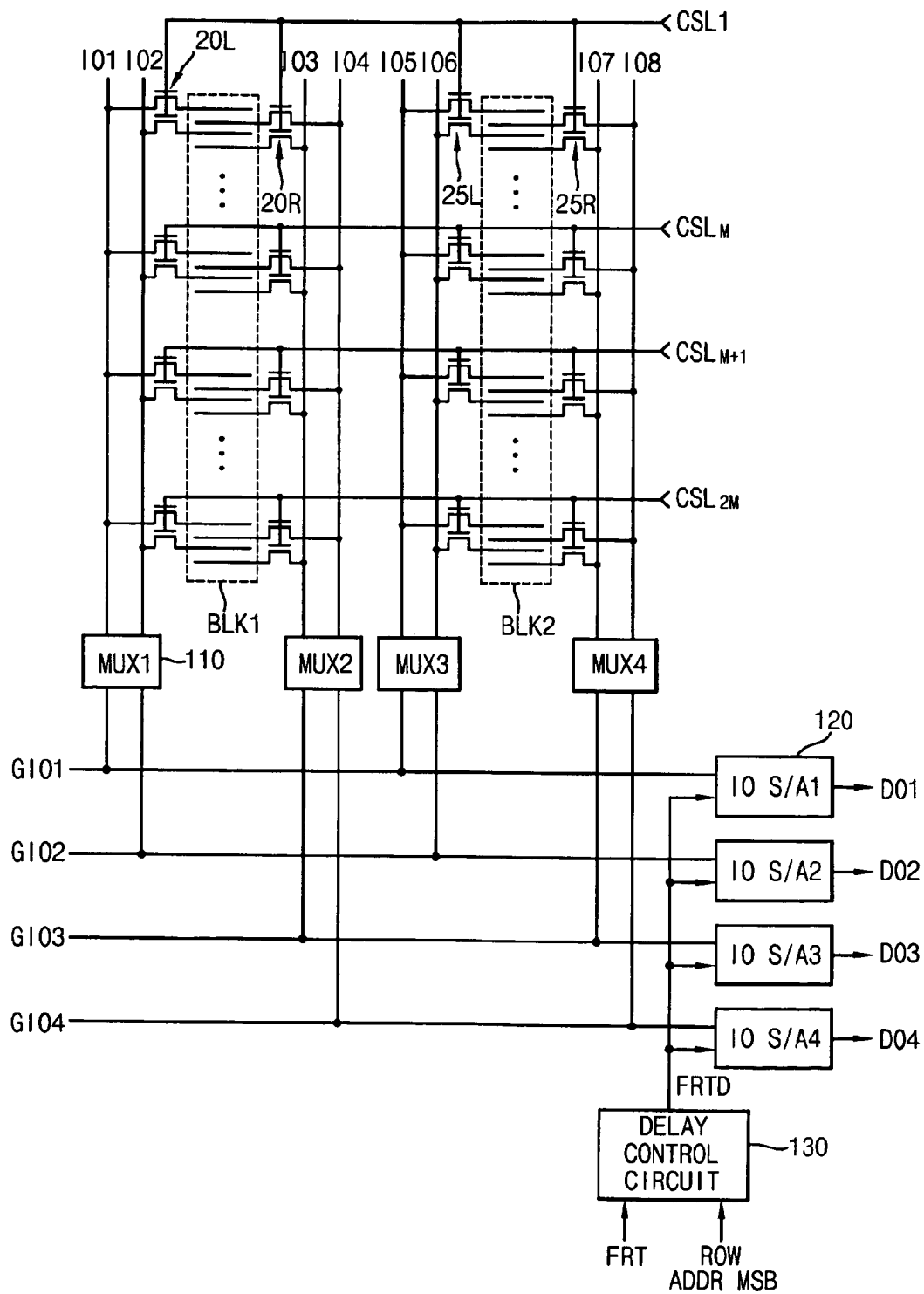
FIG. 4 is a block diagram illustrating a memory device having a delay control circuit to control a delay for a data sampling signal according to an example embodiment of the present invention.

FIG. 4 is a block diagram illustrating a memory device having a delay control circuit to control a delay of a data sampling signal (FRT) according to an example embodiment of the present invention.

In FIG. 4, the memory device may include two memory blocks BLK1 and BLK2. Each of the memory blocks having four data input/output lines GIO1 to GIO4 connected thereto.

The memory device may further include column selection switches 20L, 20R, 25L, 25R, multiplexers 110 (MUX1, MUX2, MUX3, MUX4), input/output sense amplifiers 120 (IO S/A1, IO S/A2, IO S/A3, IO S/A4), and a delay control circuit 130.

For the purposes of explanation, the first memory block BLK1 is spatially farther away than the second memory block BLK2 to the input/output sense amplifier 120. If the memory device includes eight memory blocks, four memory blocks are grouped into the first memory BLK1 and the other four memory blocks are grouped into the second memory BLK2.

The column selection switches 20L, 20R, 25L, 25R are coupled to the corresponding column selection signals CSL1, . . . , CSLM, CSLM+1, . . . , CSL2M, which are commonly provided to the first and second memory blocks BLK1 and BLK2. The column selection signals CSL1, ..., CSLM, CSLM+1, ..., CSL2M may be output from the same column decoder (not shown) and synchronized to each other.

Depending on the column selection signals CSL1, ..., CSLM, CSLM+1, ..., CSL2M, the appropriate column selection switch 20L, 20R, 25L, 25R is selectively turned on to select a particular bit line of either the first or second memory block BLK1, BLK2. Data of a memory cell coupled to the selected bit line is transferred to the corresponding input/output line IO1~IO8.

The appropriate multiplexer 110 (MUX1, MUX2, MUX3, MUX4) selects either the first memory block BLK1 or the second memory block BLK2 so that input/output lines IO1~IO4 or IO5~IO8 corresponding to the selected memory block are connected to the data input/output lines GIO1~GIO4. Thereby, the selected data is transferred to the data input/output lines GIO1~GIO4 from the input/output lines IO1~IO4 or IO5~IO8.

From the input/output lines GIO1~GIO4, the selected data are provided to the input/output sense amplifier 120 (IO S/A1~IO S/A4) and sampled, i.e., sensed, in response to the data sampling signal (FRTD) output from the delay control circuit 130. The input/output sense amplifier 120 amplifies the sensed data. The input/output sense amplifier 120 amplifies the detected amount of current flowing through the data input/output lines GIO1~GIO4. The data sampling signal (FRTD) has a delay (time), which may correspond to the spatial distance between the memory block BLK1, BLK2 and the input/output sense amplifier 120. The delay control circuit 130 may generate the data sampling signal (FRTD) based on a data sampling signal (FRT) and row address information.

The row address information may correspond to a most significant bit (MSB) of the row address, if the memory device includes two memory blocks. Additionally, the row address information may correspond to the most significant bit (MSB) and a second most significant bit (MSB-1) (see FIG. 7) of the row address, if the memory device includes four memory blocks.

Figure 5:
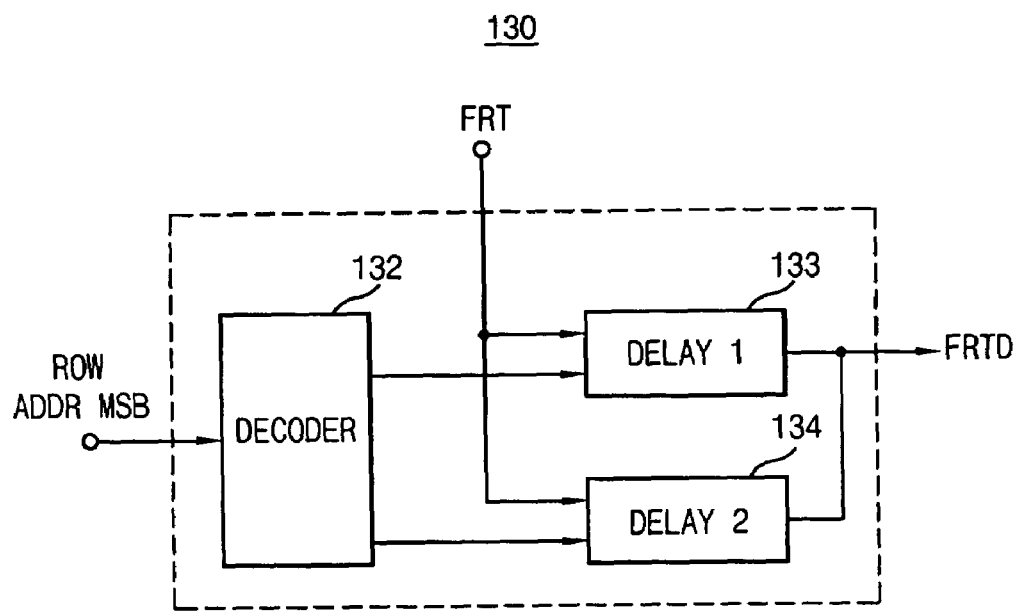
FIG. 5 is an example block diagram illustrating in detail a delay control circuit of FIG. 4.
Figure 6:
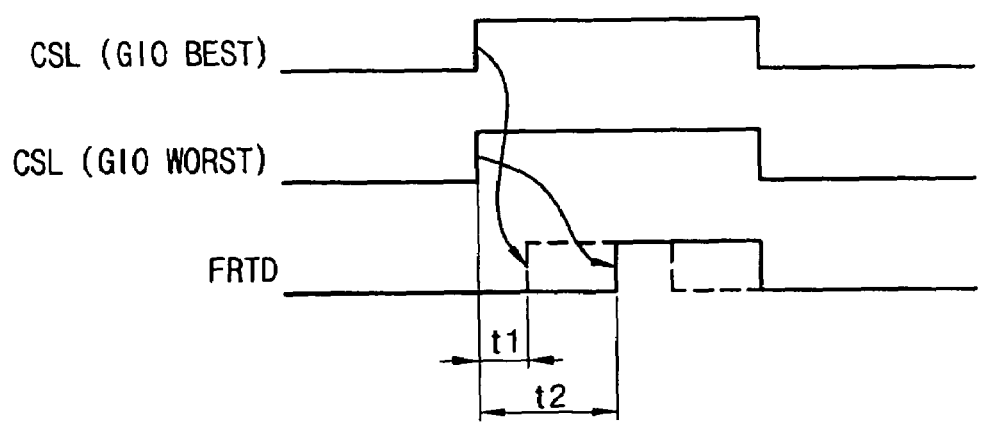
FIG. 6 is a timing diagram illustrating delay characteristics of the data sampling signal of FIG. 5.

FIG. 5 is an example block diagram illustrating in detail the delay control circuit of FIG. 4. FIG. 6 is a timing diagram illustrating delay characteristics of the data sampling signal (FRTD) of FIG. 5.

Referring to FIG. 5, the delay control circuit 130 may include a decoder 132, a first delay circuit 133 (DELAY 1) and a second delay circuit 134 (DELAY 2).

When the memory device includes two memory blocks BLK1 and BLK2, the decoder 132 may decode the most significant bit (MSB) of the row address. For example, when the MSB of the row address has a binary value "0," the memory block BLK2 is selected (enabled) and the first delay circuit 133 produces a data sampling signal (FRTD) delayed by a time period t1 with respect to the column selection signal (GIO BEST), wherein the time period of t1 corresponds to a distance between the memory block BLK2 and the input/output sense amplifier 120 (see FIG. 6).

When the MSB of the row address is a binary value "1," the memory block BLK1 is selected (enabled) and the second delay circuit 134 produces a data sampling signal (FRTD) delayed by a time period t2 with respect to the column selection signal (GIO WORST), wherein the time period of t2 corresponds to a distance between the memory block BLK1 and the input/output sense amplifier 120 (see FIG. 6). Here, the time period t2 is longer than the time period t1.

In other words, the delay control circuit 130 may generate the data sampling signal (FRTD) having a predetermined time delay based on information concerning the physical distance in a row direction between a specific memory block BLK1, BLK2 and the input/output sense amplifier 120. Thus, the delay time of the data sampling signal (FRTD) is adjusted based on the physical location of a memory cell data in memory block with respect to the input/output sense amplifier 120. Although, the MSB and MSB-1 of the row address is given as an example in the present embodiment, it should be noted that any information that indicates the physical distance between the memory block and the input/output sense amplifier 120 may be used.

Therefore, the delay characteristics of the data sampling signal (FRT) is adjusted such that the effective sampling period WINDOW of the data sampling signal (FRT) may be increased.

The delay circuits 133 and 134 may include serially connected inverters. The delay time t1, t2 of the data sampling signal (FRTD) may be adjusted by the number of inverters.

Figure 7:
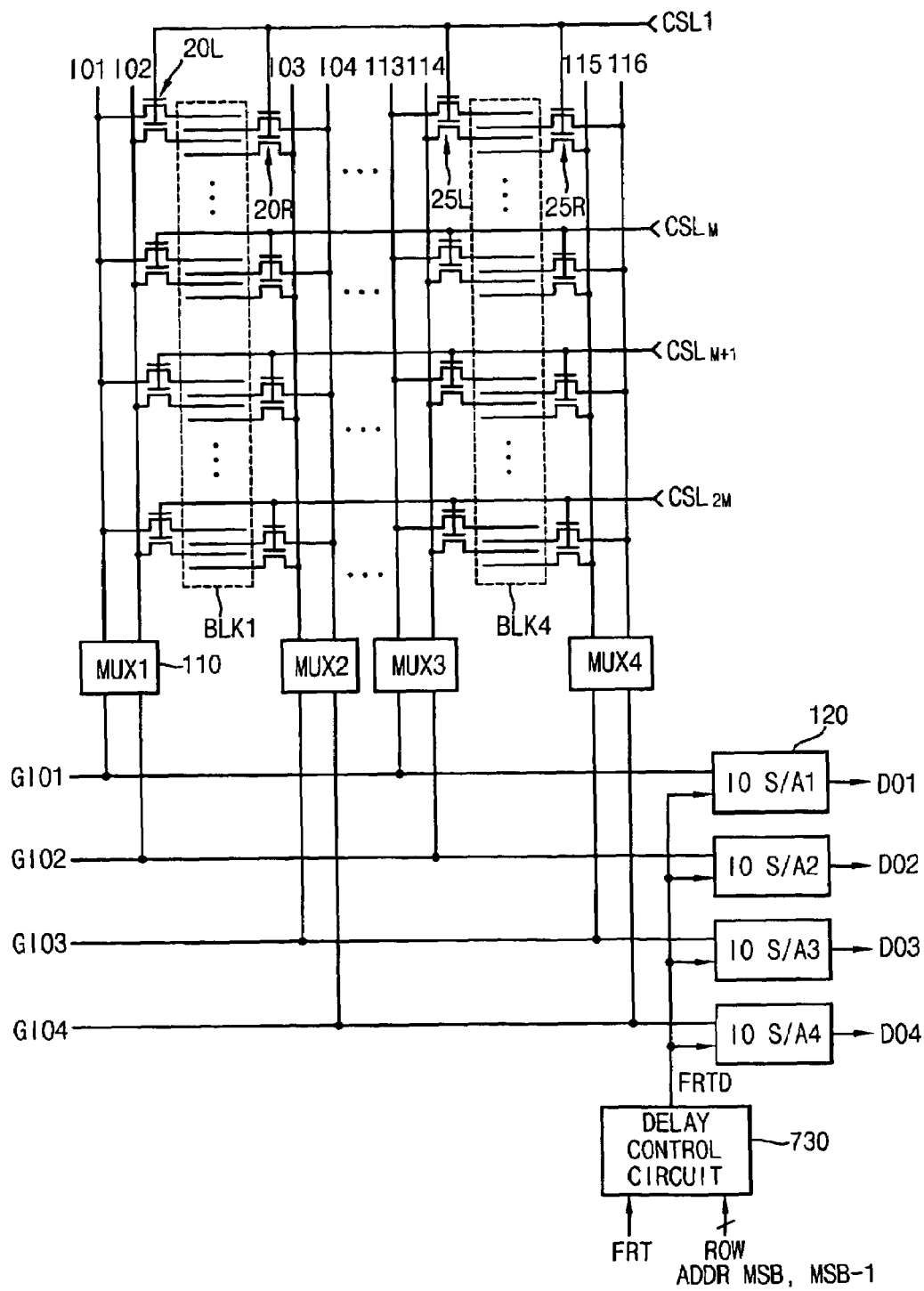
FIG. 7 is a block diagram illustrating a memory device having a delay control circuit to control a delay of a data sampling signal according to another example embodiment of the present invention.
Figure 8:
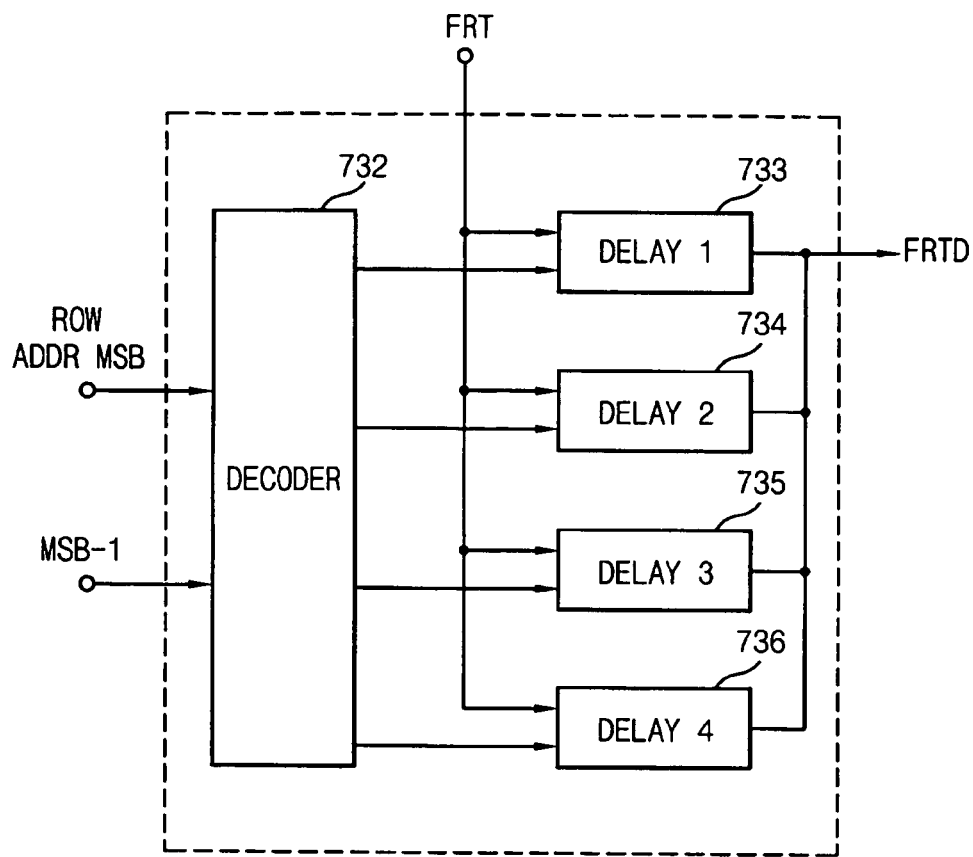
FIG. 8 is an example block diagram illustrating in detail a delay control circuit of FIG. 7.
Figure 9:
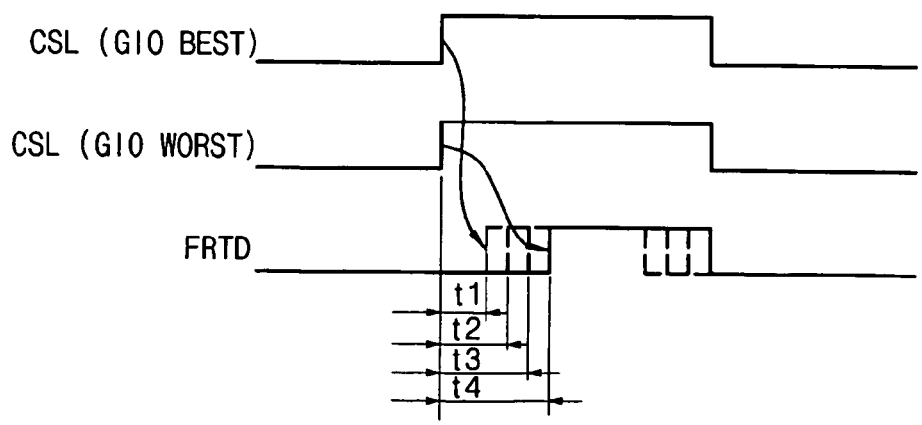
FIG. 9 is a timing diagram illustrating delay characteristics of the data sampling signal of FIG. 8.

FIG. 7 is a block diagram illustrating a memory device having a delay control circuit to control a delay of a data sampling signal (FRT) according to another example embodiment of the present invention. FIG. 8 is an example block diagram illustrating in detail a delay control circuit of FIG. 7. FIG. 9 is a timing diagram illustrating the delay characteristics of the data sampling signal (FRTD) of FIG. 8.

In the example embodiment of FIG. 7, the memory device may include four memory blocks BLK1~BLK4. The memory device in FIG. 7 is similar to the memory device in FIG. 4. Both MSB and MSB-1 of the row address are input to the delay control circuit 730. Details explanation of similar analogous elements to FIG. 4 will be omitted.

The discussion herein is directed mainly to a memory device comprising four memory blocks; however, it is noted that the present embodiment can be applied to a memory device comprising more than four memory blocks. The memory block BLK1 is spatially the farthest away and the memory block BLK4 is spatially the closest from the input/output sense amplifier.

The memory blocks in the memory device may be divided into a first memory block group having two memory blocks relatively far from the input/output sense amplifier 120 and a second memory block group having two memory blocks relatively close to the input/output sense amplifier 120.

When the most significant bit and the second most significant bit (MSB and MSB-1) of the row address are a binary value "00," respectively, the second memory block group closest to the input/output sense amplifier 120 is selected and the memory block BLK4 nearest to the input/output sense amplifier 120 in the second memory block group is selected. A first delay circuit 733 (DELAY 1) (see FIG. 8) of the delay control circuit 730 produces a data sampling signal (FRTD) delayed by a time period t1 with respect to a column selection signal (GIO BEST), wherein the time period t1 corresponds to a distance between the memory block BLK4 and the input/output sense amplifier 120 (see FIG. 9).

When the most significant bit and the second most significant bit (MSB and MSB-1) of the row address are a binary value "01," respectively, the memory block BLK3 second nearest to the input/output sense amplifier 120 is selected. The second delay circuit 734 (DELAY 2) produces a data sampling signal (FRTD) delayed by a time period t2 with respect to a column selection signal (GIO BEST), wherein the time period t2 corresponds to a distance between the input/output sense amplifier 120 and the memory block BLK3 (see FIG. 9).

When the most significant bit and the second most significant bit (MSB and MSB-1) of the row address are a binary value "10," respectively, the memory block BLK2 third nearest to the input/output sense amplifier 120 in the first memory block group is selected. The third delay circuit 735 (DELAY 3) produces a data sampling signal (FRTD) delayed by a time period t3 with respect to a column selection signal (GIO BEST), wherein the time period t3 corresponds to a distance between the input/output sense amplifier 120 and the memory block BLK2 (see FIG. 9).

In addition, when the most significant bit and the second most significant bit (MSB and MSB-1) of the row address are a binary value "11," respectively, the fourth delay circuit 736 (DELAY 4) produces a data sampling signal (FRTD) delayed by a time period t4 with respect to a column selection signal (GIO BEST), wherein the time period t4 corresponds to a distance between the input/output sense amplifier 120 and the memory block BLK1 of the first memory block group (see FIG. 9). Here, the time periods t1, t2, t3, t4 satisfy the relationship t4>t3>t2>t1.

The delay control circuit 730 may generate a data sampling signal (FRTD) having a predetermined time delay depending on the spatial distance between each of the memory blocks to the input/output sense amplifier 120 information.

Figure 10:
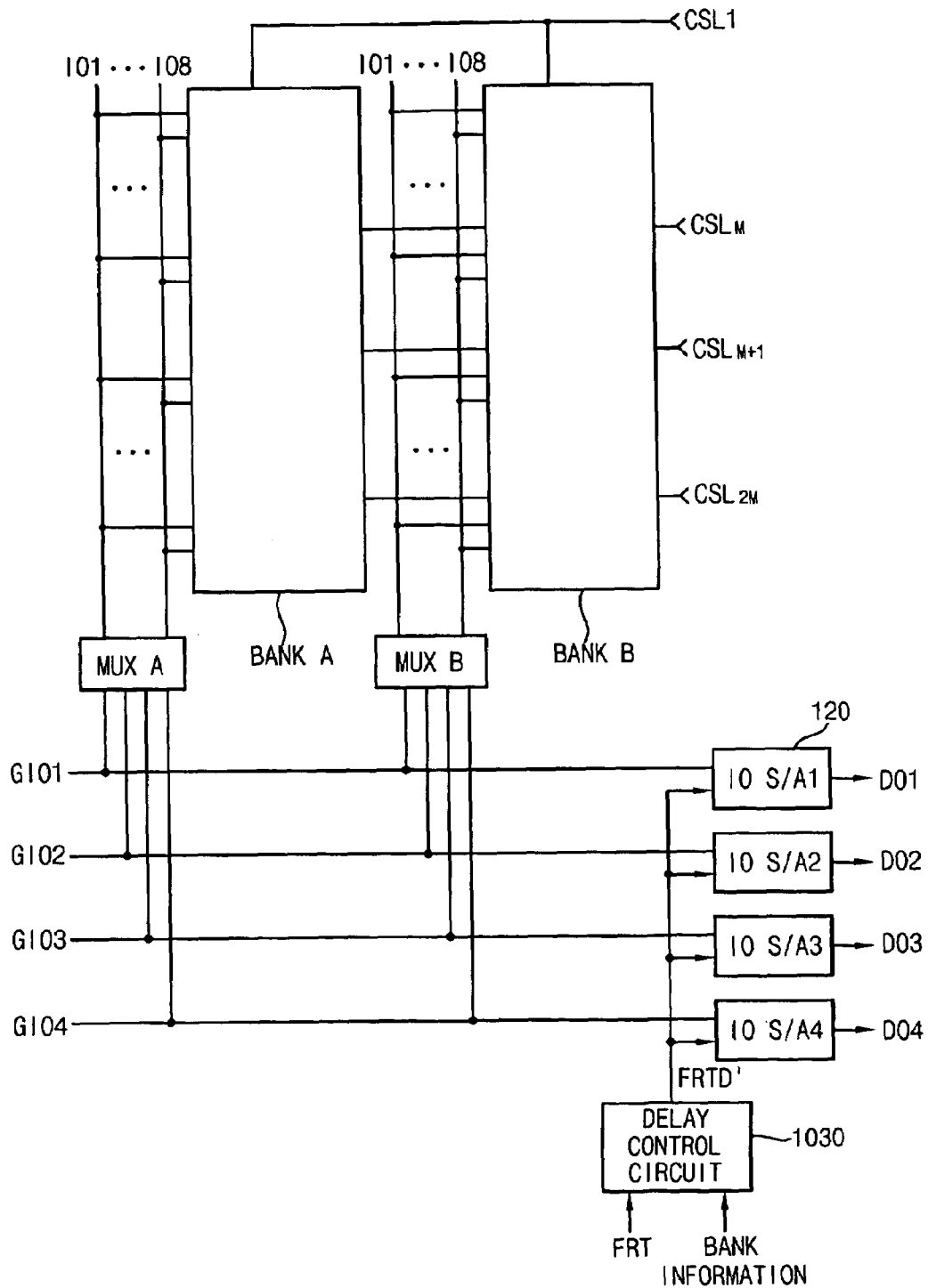
FIG. 10 is a block diagram illustrating a memory device having a delay control circuit to control a delay of a data sampling signal according to another example embodiment of the present invention.
Figure 11:
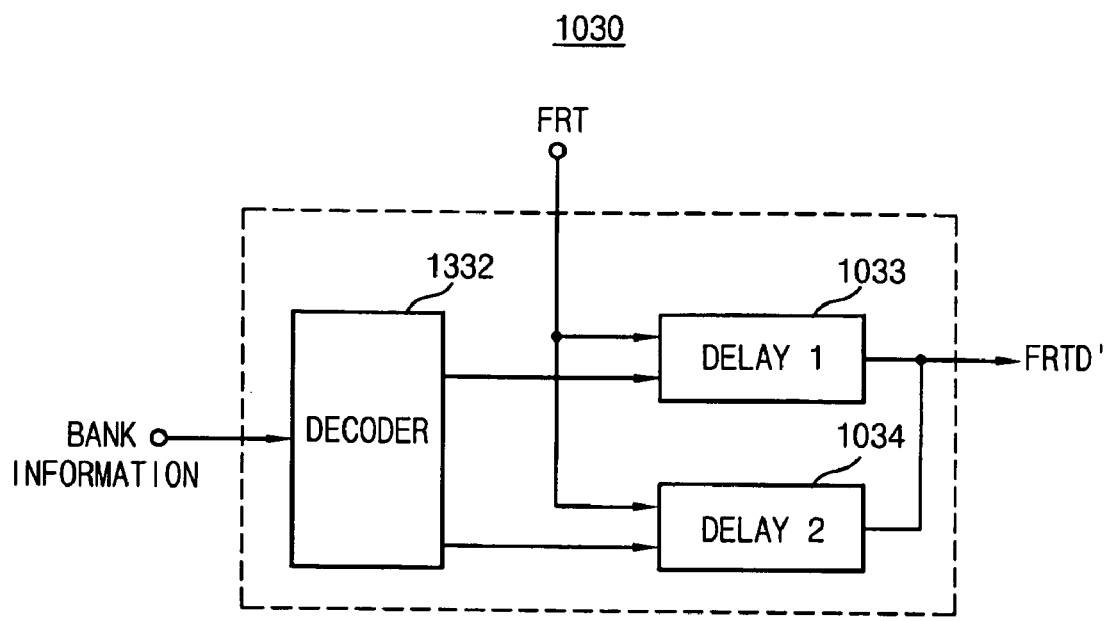
FIG. 11 is an example block diagram illustrating in detail a delay control circuit of FIG. 10.
Figure 12:
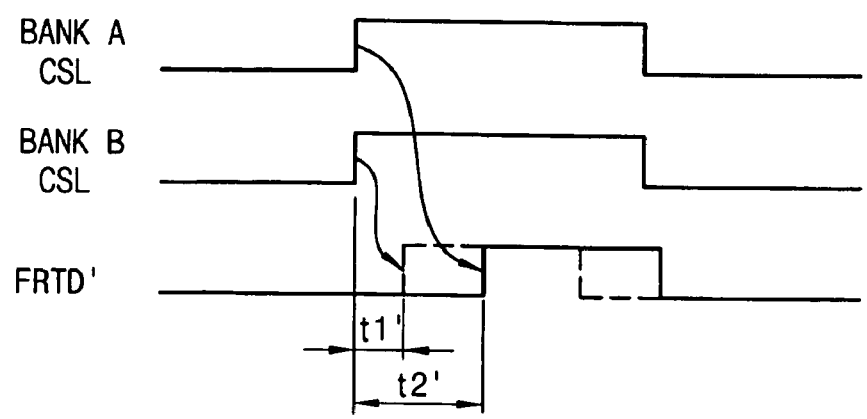
FIG. 12 is a timing diagram illustrating delay characteristics of the data sampling signal of FIG. 11.

FIG. 10 is a block diagram illustrating a memory device having a delay control circuit to control a delay of a data sampling signal (FRT) according to another example embodiment of the present invention. FIG. 11 is an example block diagram illustrating in detail a delay control circuit of FIG. 10. FIG. 12 is a timing diagram illustrating delay characteristics of the data sampling signal FRTD' of FIG. 11.

FIG. 10 illustrates an example method of delaying a data sampling signal (FRT) when the memory device may include two memory banks.

The discussion herein is directed mainly to the memory device comprising two memory banks; however, it is noted that the present invention can be applied to a memory device comprising more than two memory banks.

The memory device in FIG. 10 may include two memory banks BANK A and BANK B. In the present embodiment, instead of the MSB or MSB-1 of the row address, memory bank information is input to the delay control circuit 1030. The respective memory banks BANK A, BANK B may include a plurality of memory blocks. The memory bank BANK A is spatially further away from the input/output sense amplifier 120 then the memory bank BANK B.

In the present embodiment, a multiplexer (MUX A) selects one of the memory blocks in the memory bank BANK A so that input/output lines IO1~IO8 of the selected memory block are connected to the data input/output lines GIO1~GIO4. Therefore, a memory cell data of the selected memory block is transferred to the data input/output lines GIO1~GIO4 through the input/output lines IO1~IO8.

The delay control circuit 1030 may generate a data sampling signal (FRTD') delayed based on a data sampling signal (FRT) and the memory bank information. For example, the memory bank information may be a bit value indicative of the memory bank BANK A or the memory bank BANK B. Or, if the memory device includes four memory banks, the memory bank information may correspond to two bit data indicative of one of the four memory banks.

A decoder 1332 decodes the memory bank information. For example, when the memory bank information has a bit value "0," the memory bank BANK B is selected (enabled) and a first delay circuit 1033 (DELAY 1) produces a data sampling signal (FRTD') delayed by a time period t1 with respect to a column selection signal (BANK B CSL), wherein the time period t1 corresponds to a distance between the memory bank BANK B and the input/output sense amplifier 120 (see FIG. 12).

When the memory bank information has a bit value "1," the memory bank A is selected (enabled) and a second delay circuit 1034 (DELAY 2) produces a data sampling signal (FRTD') delayed by a time period t2 with respect to a column selection signal (BANK A CSL), wherein the time period t2 corresponds to a distance between the memory bank BANK A and the input/output sense amplifier 120 (see FIG. 12).

The delay control circuit 1030 generates the data sampling signal (FRTD') having a predetermined time delay based on information concerning the physical distance between each of the memory banks (BANK A or BANK B) and the input/output sense amplifier 120.

Figure 13:
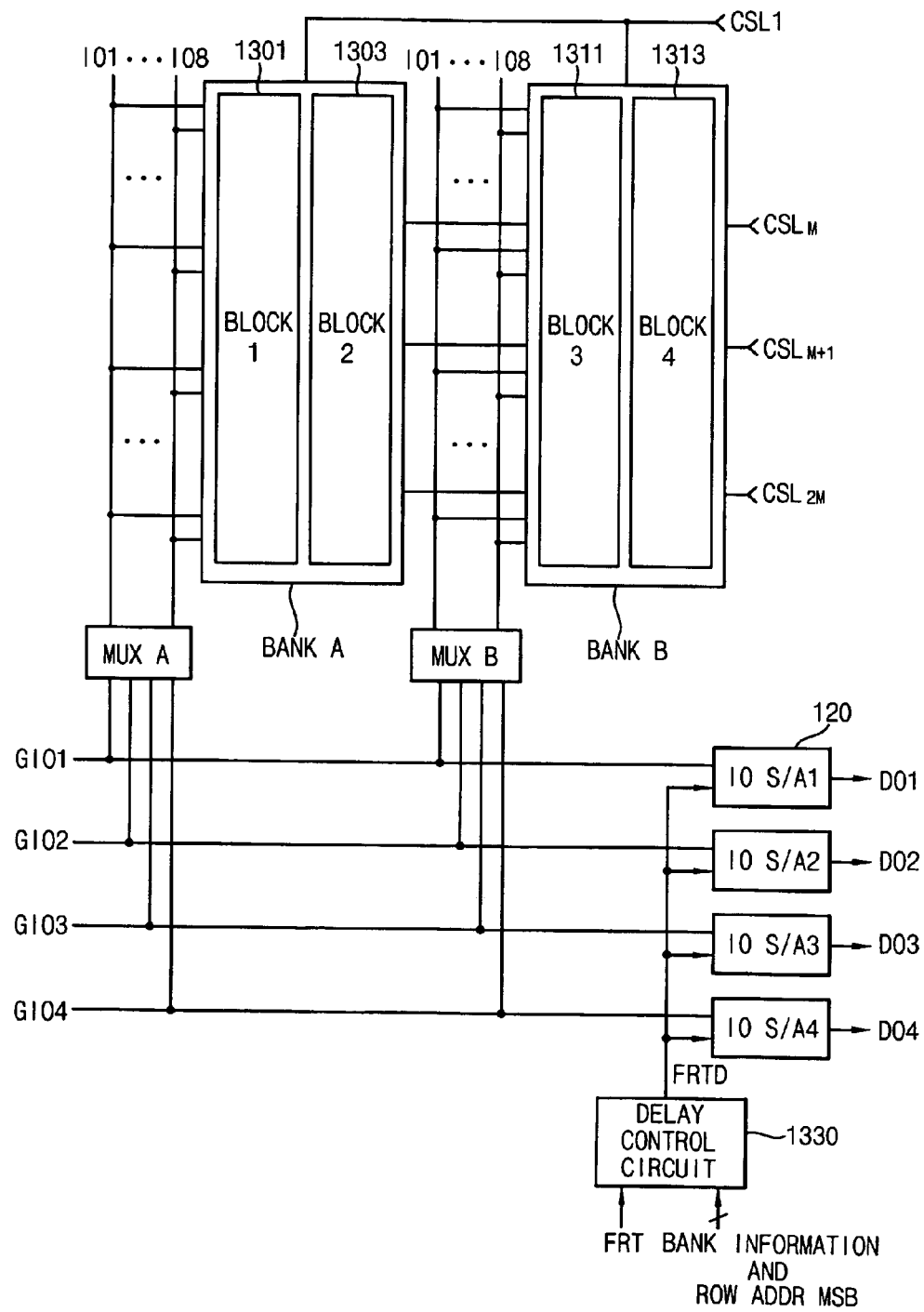
FIG. 13 is a block diagram illustrating a memory device having a delay control circuit to control a delay of a data sampling signal according to another example embodiment of the present invention.
Figure 14:
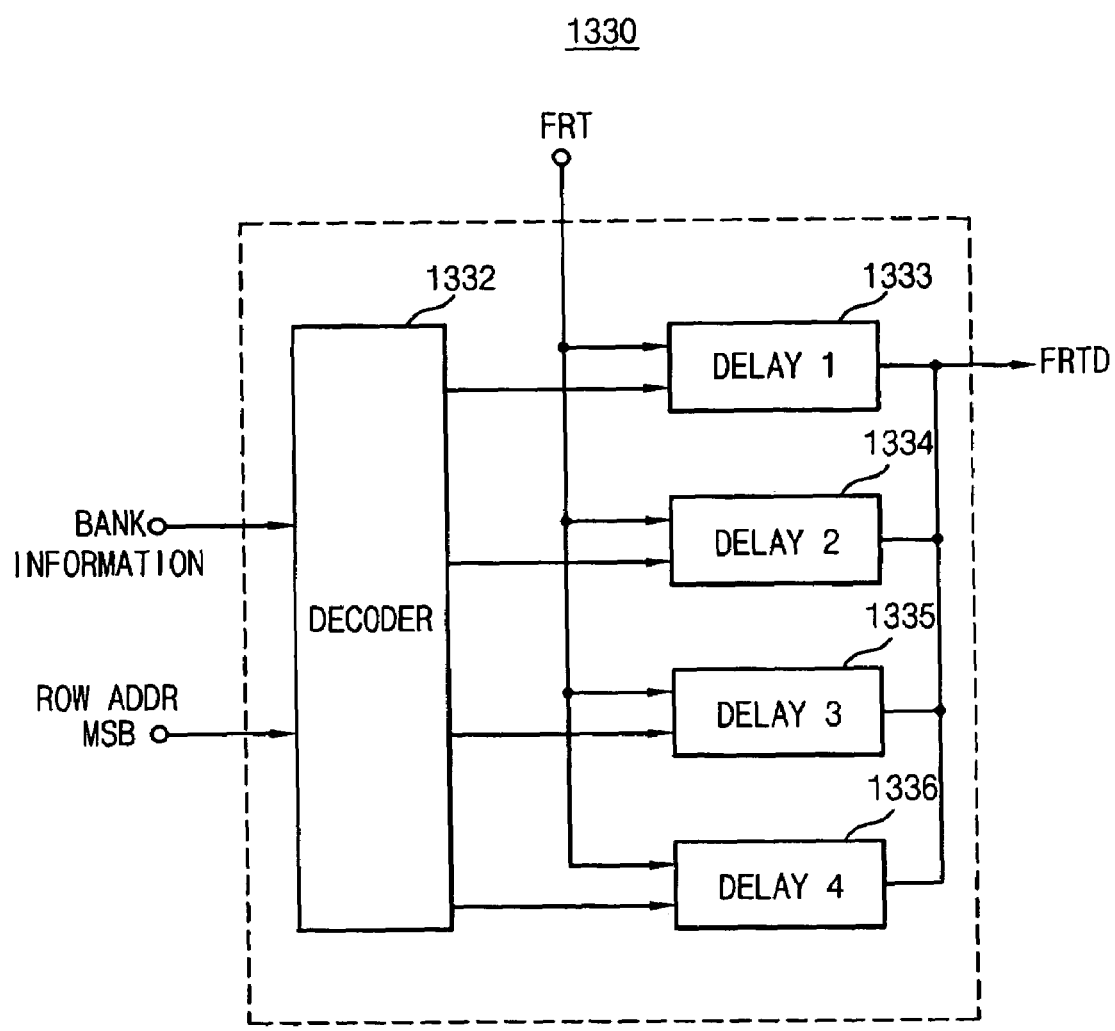
FIG. 14 is an example block diagram illustrating in detail a delay control circuit of FIG. 13.

FIG. 13 is a block diagram illustrating a memory device having a delay control circuit to control a delay of a data sampling signal (FRT) according to yet another example embodiment of the present invention. FIG. 14 is an example block diagram illustrating in details a delay control circuit of FIG. 13.

FIG. 13 is a block diagram illustrating a memory device having a delay control circuit to control a delay of a data sampling signal (FRT), where a memory device may include two memory banks (BANK A and BANK B) and each of the memory banks includes two memory blocks.

The discussion herein is directed mainly to the memory device where each of the memory banks includes two memory blocks; however, it is noted that the present invention can be applied to the memory device where each of the memory banks includes two or more memory blocks.

In the embodiment of FIG. 13, the memory bank information and the MSB of the row address are input to a delay control circuit 1330. Details of similar analogous elements to FIG. 10 will be omitted.

The delay control circuit 1330 may generate a data sampling signal (FRTD), delayed according to the memory bank information and the MSB of the row address. For example, the memory bank information may have a bit value indicative of the memory bank BANK A or the memory bank BANK B, and when each memory bank includes two memory blocks, the MSB of the row address may be indicative of one of the two memory blocks.

A decoder 1332 decodes the memory bank information and the MSB of the row address.

The delay control circuit 1330 may generate the delayed data sampling signal (FRTD) based on the memory bank information and the row address. For example, when the memory bank information has a bit value "0" and the MSB of the row address is a binary value "0," a memory block 1313 (BLOCK 4) of the memory bank BANK B is selected (enabled) and a first delay circuit 1333 (DELAY 1) produces a data sampling signal (FRTD) delayed by a time period t1 with respect to the column selection signal (CSL), wherein the time period t1 corresponds to a distance between the input/output sense amplifier 120 and the memory block 1313 (BLOCK 4).

When the memory bank information has a bit value "0" and the MSB of the row address is a binary value "1," a second delay circuit 1334 (DELAY 2) produces a data sampling signal (FRTD) delayed by a time period t2 with respect to a column selection signal (CSL), wherein the time period t2 corresponds to a distance between the input/output sense amplifier 120 and the memory block 1311 (BLOCK 3) of the memory bank BANK B.

When the memory bank information has a bit value "1" and the MSB of the row address is a binary value "0," the memory bank BANK A is selected and a third delay circuit 1335 (DELAY 3) produces a data sampling signal (FRTD) with respect to a column selection signal (CSL) by a time period t3, wherein the time period t3 corresponds to a distance between the input/output sense amplifier 120 and a memory block 1303 (BLOCK 2) of the memory bank BANK A.

When the memory bank information has a bit value "1" and the MSB of the row address is a binary value "1," a fourth delay circuit 1336 (DELAY 4) produces a data sampling signal (FRTD) with respect to a column selection signal (CSL) by a time period t4, wherein the time period t4 corresponds to a distance between the input/output sense amplifier 120 and a memory block 1301 (BLOCK 1) of the memory bank BANK A.

The delay control circuit 1330 of the present embodiment may generate a data sampling signal (FRTD) having a predetermined time delay based on information concerning the physical distance between each of the memory banks (BLOCK 1, BLOCK 2, BLOCK 3, BLOCK 4) and the input/output sense amplifier 120.

Figure 15:
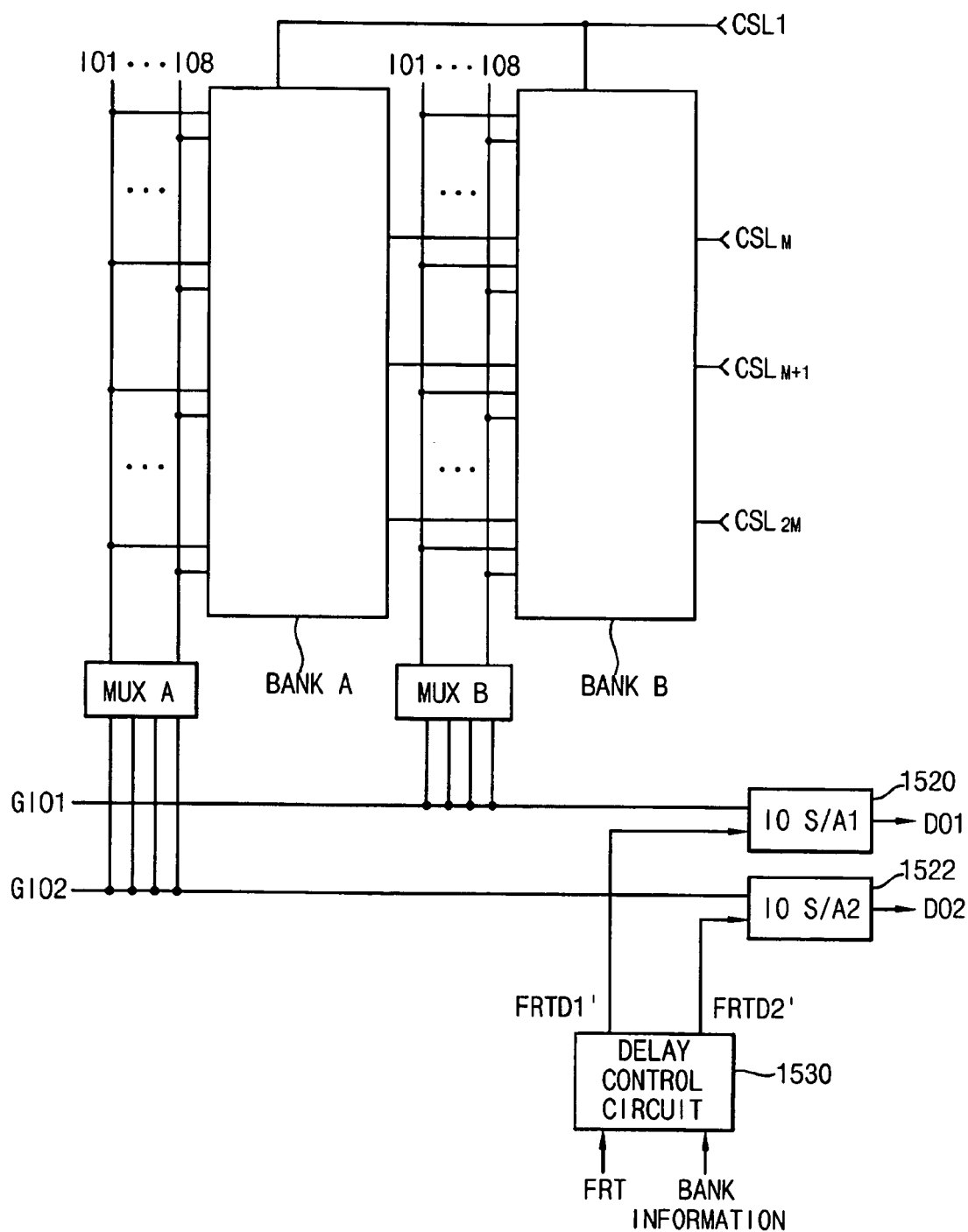
FIG. 15 is a block diagram illustrating a memory device having a delay control circuit to control a delay of a data sampling signal according to still another example embodiment of the present invention.
Figure 16:
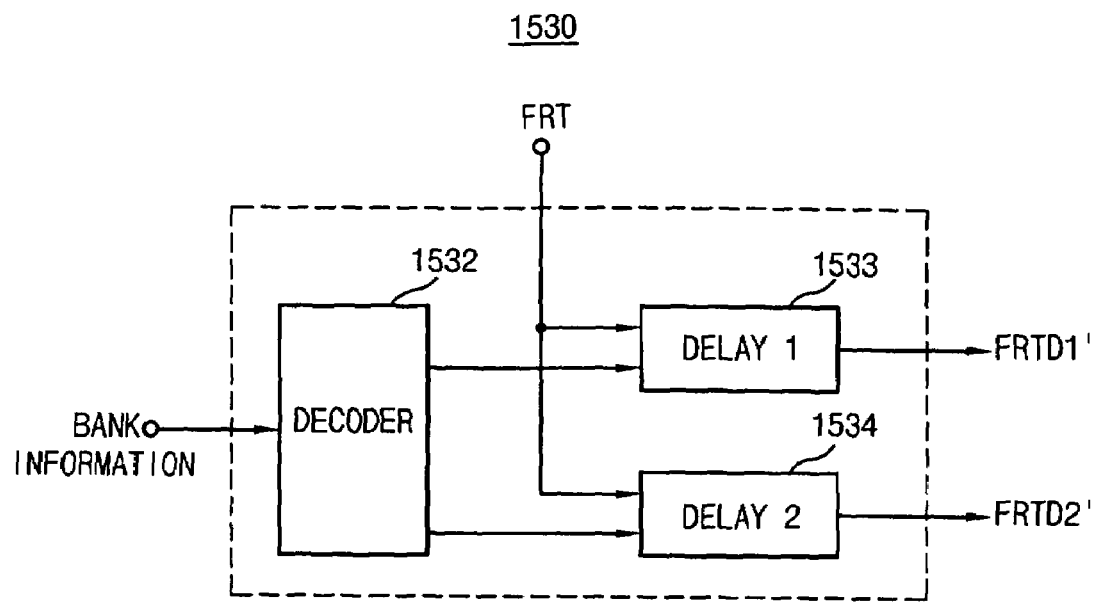
FIG. 16 is an example block diagram illustrating in detail a delay control circuit of FIG. 15.
Figure 17:
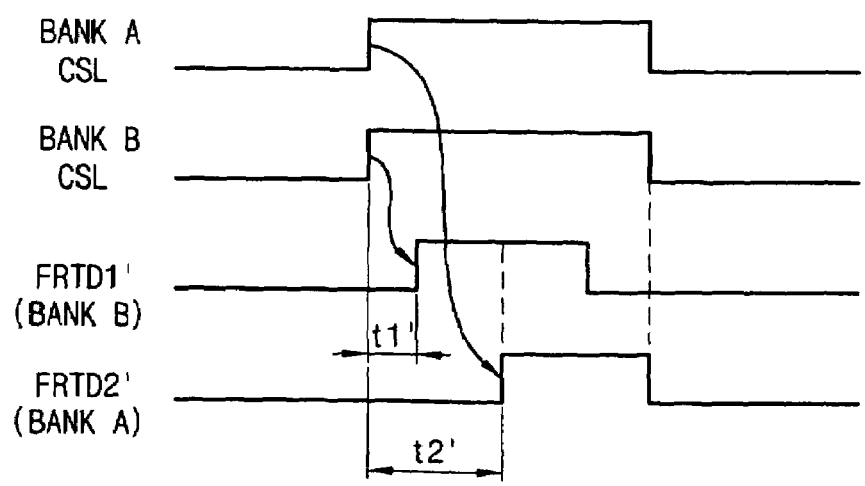
FIG. 17 is a timing diagram illustrating delay characteristics of the data sampling signal of FIG. 16.

FIG. 15 is a block diagram illustrating a memory device having a delay control circuit to control the delay of a data sampling signal (FRT) according to still another example embodiment of the present invention. FIG. 16 is an example block diagram illustrating in details a delay control circuit of FIG. 15. FIG. 17 is a timing diagram illustrating delay characteristics of the data sampling signal FRTD1', FRTD2' of FIG. 16.

In the example embodiment of FIG. 15, the memory device has two memory banks (or two memory blocks) and two input/output sense amplifiers. Data from a memory bank (or a memory block) closest to the input/output sense amplifier in the row direction is sensed by a first input/output sense amplifier 1520 (IO S/A1) and data from a memory bank (or a memory block) farthest away from the input/output sense amplifier is sensed by a second input/output sense amplifier 1522 (IO S/A2).

The discussion herein is directed mainly to the memory device including two memory banks (or two memory blocks); however, it is noted that the present invention can be applied to a memory device comprising more than two memory banks (or memory blocks).

The memory device in FIG. 15 may include two memory banks (BANK A and BANK B) and memory bank information is input to a delay control circuit 1530. The respective memory banks may include a plurality of memory blocks.

For example, a multiplexer (MUX A) selects one of the memory blocks in the memory bank BANK A so that input/output lines IO1~IO8 of the selected memory block are connected to the data input/output line GIO2. Therefore, a memory cell data in the selected memory block is transferred to the data input/output line GIO2 through the input/output lines IO1~IO8.

The delay control circuit 1530 generates data sampling signals (FRTD1') and (FRTD2') delayed according to the memory bank information. For example, the memory bank information may have a bit value indicative of the memory bank BANK A or the memory bank BANK B.

A decoder 1532 decodes the memory bank information to enable either a first delay circuit 1533 (DELAY 1) and or a second delay circuit 1534 (DELAY 2).

When a memory bank information has a bit value "0", the memory bank BANK B is selected (enabled) and the first delay circuit 1533 (DELAY 1) delays a data sampling signal (FRT) by a time period t1 with respect to a column selection signal (BANK B CSL) to produce a data sampling signal (FRTD1'), wherein the time period t1 corresponds to a distance between the input/output sense amplifier 1520 and the memory bank BANK B (see FIG. 17). The data sampling signal (FRTD1') is provided to the first input/output sense amplifier 1520.

When a memory bank information has a bit value "1," the memory bank BANK A is selected and a second delay circuit 1534 (DELAY 2) delays a data sampling signal (FRT) by a time period t2 with respect to a column selection signal (BANK A CSL) to produce a data sampling signal (FRTD2'), wherein the time period t2 corresponds to a distance between the input/output sense amplifier 1522 and the memory bank BANK A (see FIG. 17). The data sampling signal (FRTD2') is provided to a second input/output sense amplifier 1522. Here, the time period t2 is longer than the time period t1.

Figure 18:
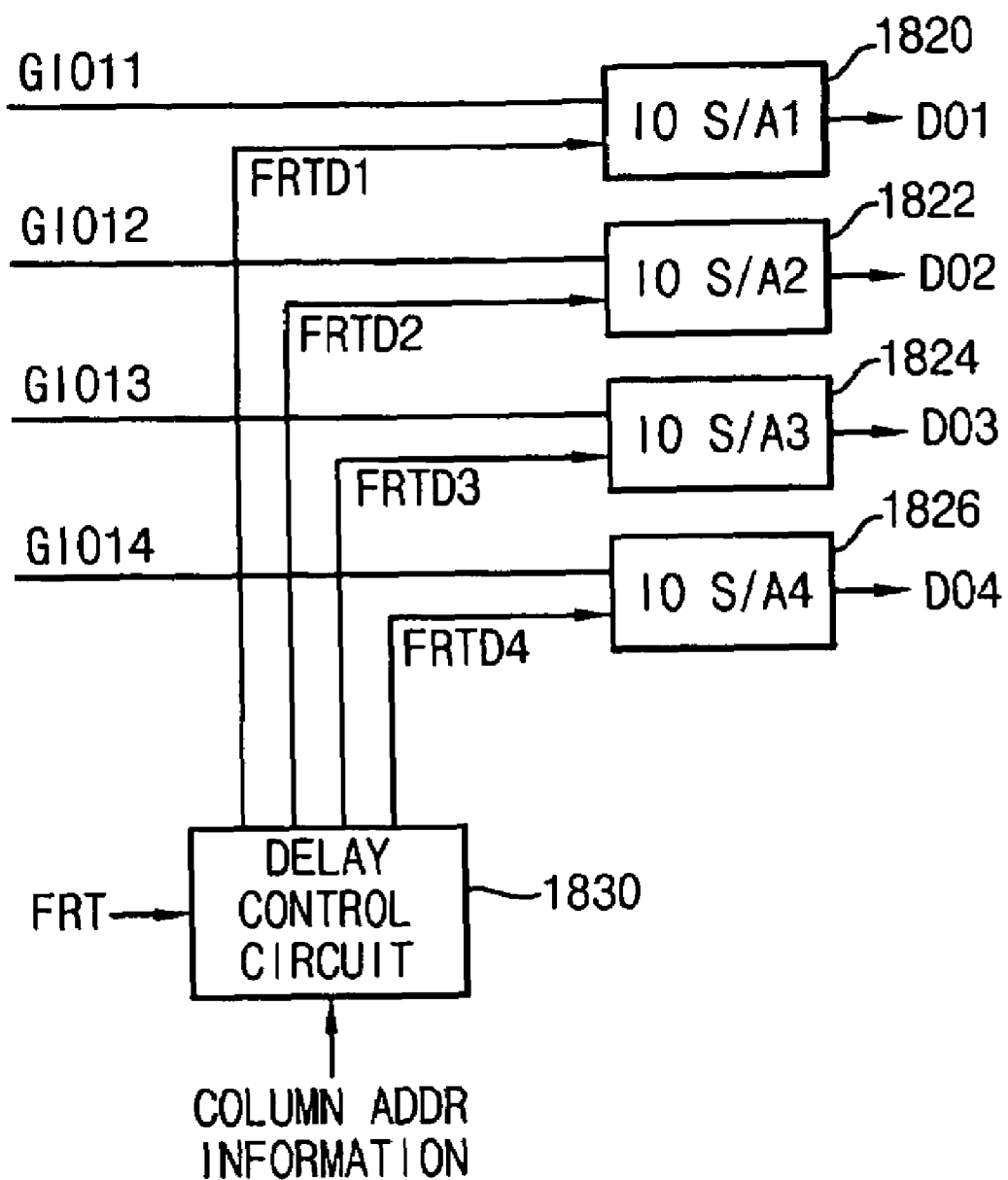
FIG. 18 is a block diagram illustrating a memory device having a delay control circuit to control a delay of a data sampling signal according to yet another example embodiment of the present invention.
Figure 19:
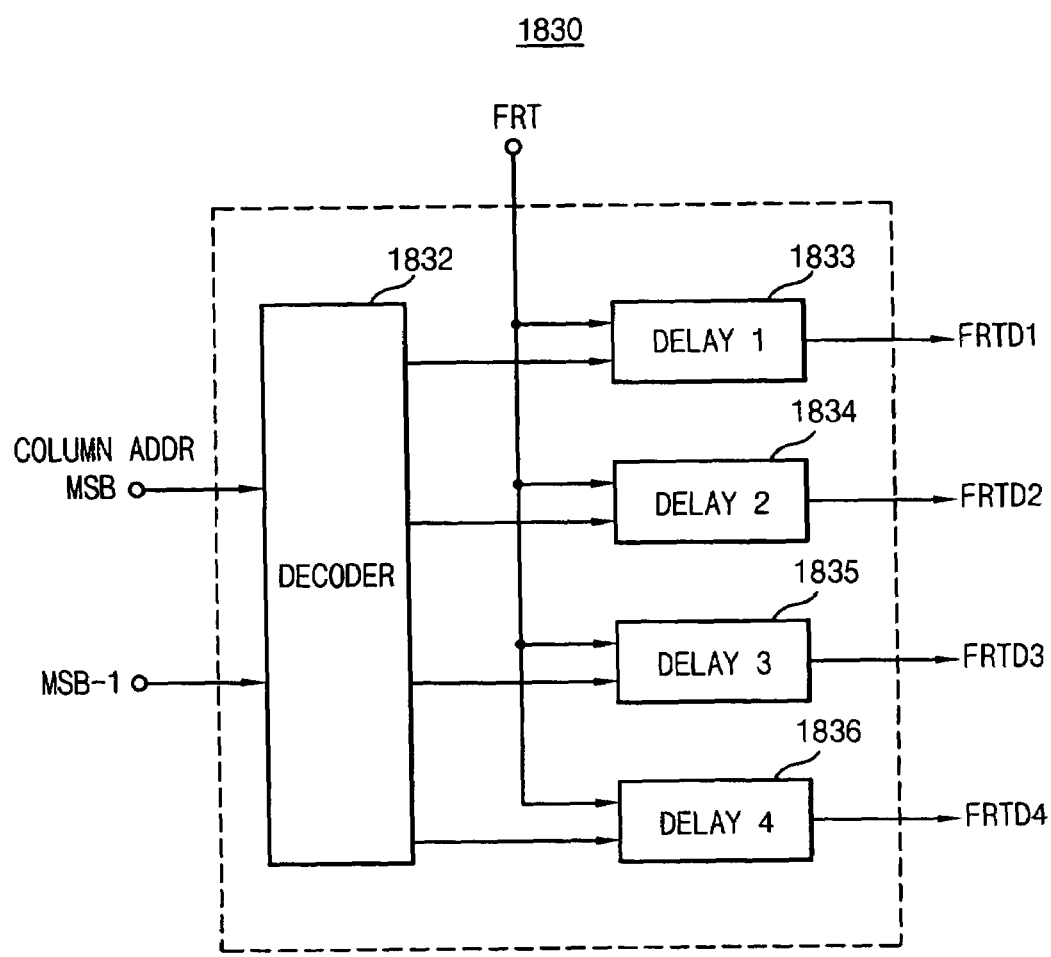
FIG. 19 is an example block diagram illustrating in detail a delay control circuit of FIG. 18.

FIG. 18 is a block diagram illustrating a memory device having a delay control circuit to control the delay of the data sampling signal (FRT) according to still another example embodiment of the present invention. FIG. 19 is an example block diagram illustrating in detail a delay control circuit of FIG. 18.

In the example embodiment of FIG. 18, a predetermined delay is added to a data sampling signal (FRT) corresponding to the physical distance in a column direction between each memory block and an input/output sense amplifier.

In FIG. 18, a memory device may have first through fourth sub memory blocks (not shown) that are distanced from the input/output sense amplifier.

A delay control circuit 1830 generates a data sampling signals (FRTD1) to (FRTD4) having a predetermined time delay based on information concerning the physical distance in the column direction between each of the memory blocks and the input/output sense amplifier. Hereinafter, a MSB (or both MSB and MSB-1) of the column address may indicate information of the physical distance in the column direction between each of the memory blocks and the input/output sense amplifier. However, it is noted that other information may be used for this purpose.

The delay control circuit 1830 receives a data sampling signal (FRT) to generate a plurality of data sampling signals (FRTD1) through (FRTD4) delayed according to the column address information. For example, the column address information may include the most significant bit and the second most significant bit (MSB and MSB-1) of the column address, if the memory device has four sub memory blocks arranged in the column direction. Additionally, the column address information may only include the most significant bit (MSB) of the column address, if the memory device has two sub memory blocks arranged in the column direction.

First through fourth input/output sense amplifiers 1820, 1822, 1824 and 1826 receive data output from the first through fourth sub memory blocks through data input/output lines GIO11, GIO12, GIO13 and GIO14, respectively.

A decoder 1832 decodes the MSB and MSB-1 of the column address to enable one of first through fourth delay circuits 1833 (DELAY 1), 1834 (DELAY 2), 1835 (DELAY 3) and 1836 (DELAY 4).

When upper two bits (MSB and MSB-1) of the column address have a bit value "00," respectively, the first sub memory block (not shown) that is nearest to the input/output sense amplifier in the column direction is selected. The first delay circuit 1833 (DELAY 1) delays a data sampling signal (FRT) by a time period t1 with respect to a column selection signal (CSL) to generate a data sampling signal (FRTD 1), wherein the time period t1 corresponds to a distance between the first sub memory block and the input/output sense amplifier. The data sampling signal (FRTD1) is provided to the first input/output sense amplifier 1820.

Data provided from the first data input/output line (GIO11) to the first input/output sense amplifier 1820 are sampled in response to the input delayed data sampling signal (FRTD1). The first data input/output line (GIO11) is connected to the first sub memory block (not shown) nearest to the input/output sense amplifier in the column direction through input/output lines.

When the upper two bits (MSB and MSB-1) of the column address have a bit value "01," respectively, the second sub memory block (not shown) that is second nearest to the input/output sense amplifier in the column direction is selected. The second delay circuit 1834 (DELAY 2) delays a delayed data sampling signal (FRT) by a time period t2 with respect to a column selection signal (CSL) to generate a data sampling signal (FRTD2), wherein the time period t2 corresponds to a distance between the second sub memory block and the input/output sense amplifier. The data sampling signal (FRTD2) is provided to a second input/output sense amplifier 1822.

Data provided from a second data input/output line (GIO12) are sampled by the second input/output sense amplifier 1822 in response to an input delayed data sampling signal (FRTD2). The second data input/output line GIO12 is connected to the second sub memory block (not shown) that is second nearest to the input/output sense amplifier in the column direction through input/output lines.

When the upper two bits (MSB and MSB-1) of the column address have a bit value "10," respectively, a third sub memory block (not shown) that is third nearest to the input/output sense amplifier in the column direction is selected. The third delay circuit 1835 (DELAY 3) delays a data sampling signal (FRT) by a time period t3 with respect to a column selection signal (CSL) to generate a data sampling signal (FRTD3), wherein the time period t3 corresponds to a distance between the third sub memory block and the input/output sense amplifier. The data sampling signal (FRTD3) is provided to the third input/output sense amplifier 1824.

Data provided from a third data input/output line (GIO13) are sampled by a third input/output sense amplifier 1824 in response to an input delayed data sampling signal (FRTD3). The third data input/output line (GIO13) is connected to a third sub memory block (not shown) that is third nearest to the input/output sense amplifier in the column direction through input/output lines.

When the upper two bits (MSB and MSB-1) of the column address have a bit value "11," respectively, a fourth sub memory block (not shown) located farthest from the input/output sense amplifier in the column direction is selected and a fourth delay circuit 1836 (DELAY 4) delays a data sampling signal (FRT) with respect to a column selection signal (CSL) by a time period t4 to generate a data sampling signal (FRTD4), wherein the time period t4 corresponds to a distance between the fourth sub memory block and the input/output sense amplifier. The data sampling signal (FRTD4) is provided to the fourth input/output sense amplifier 1826. Here, the time periods t1, t2, t3, t4 satisfy the relationship t4>t3>t2>t1.

Data provided to the fourth input/output sense amplifier 1826 through the fourth data input/output line (GIO14) are sampled in response to an input delayed data sampling signal (FRTD4). The fourth data input/output line (GIO14) is connected to a fourth sub memory block (not shown) located farthest from the input/output sense amplifier in the column direction through input/output lines.

The delay control circuit 1830 generates the data sampling signals (FRTD1) through (FRTD4) having the predetermined time delays based on information concerning the physical distance between each of the first through fourth sub memory blocks and the input/output sense amplifier.

When the memory device can be divided into two sub memory blocks based on the physical distance in the column direction, the delay control circuit 1830 delays the data sampling signal (FRT) by a time period t1 with respect to the column selection signal (CSL), wherein the time period t1 (or time period of t2>t1) corresponds to a distance between the input/output sense amplifier and the first sub memory block closest to the input/output sense amplifier (or second sub block far from the input/output sense amplifier). The delayed data sampling signal (FRT) is provided to the corresponding input/output sense amplifier as the data sampling signal (FRTD1) or (FRTD2).

Figure 20:
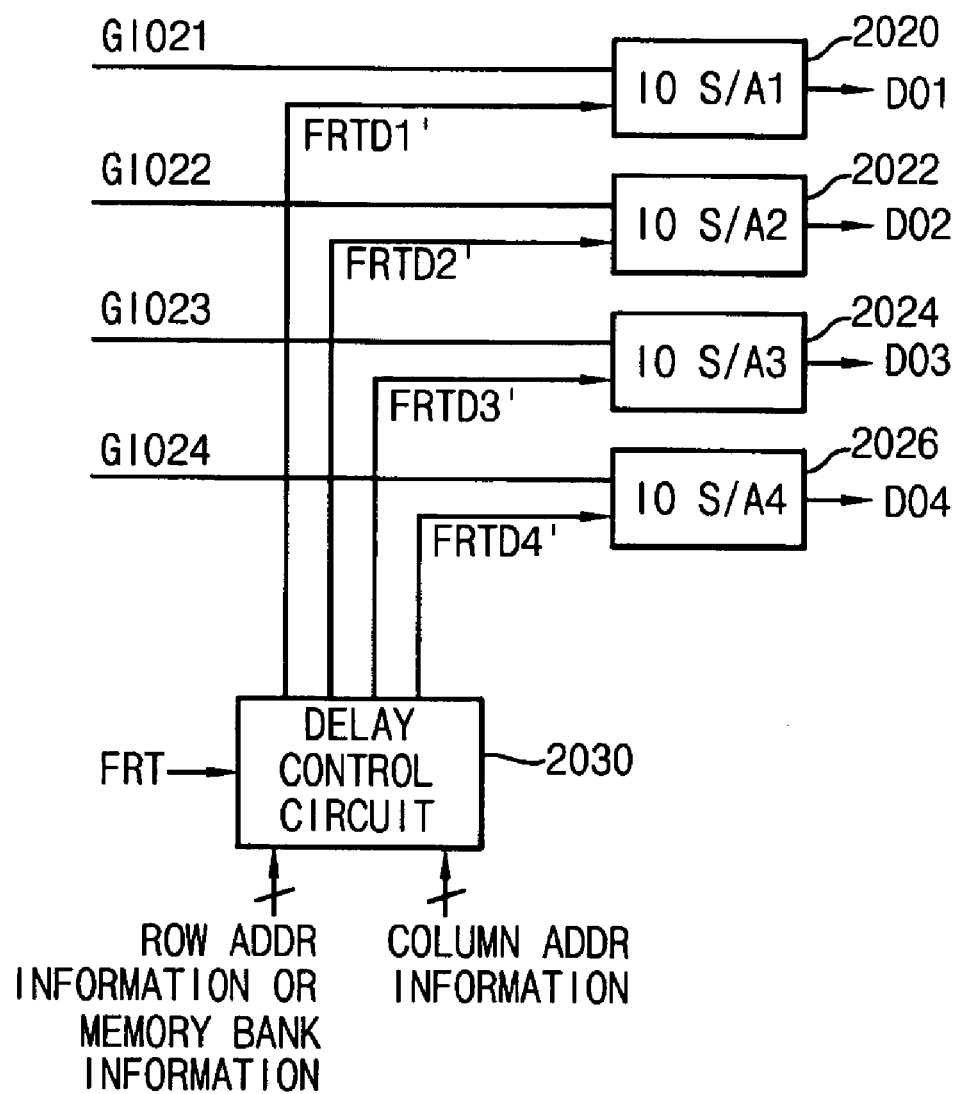
FIG. 20 is a block diagram illustrating a memory device having a delay control circuit to control a delay of a data sampling signal according to still another example embodiment of the present invention.
Figure 21:
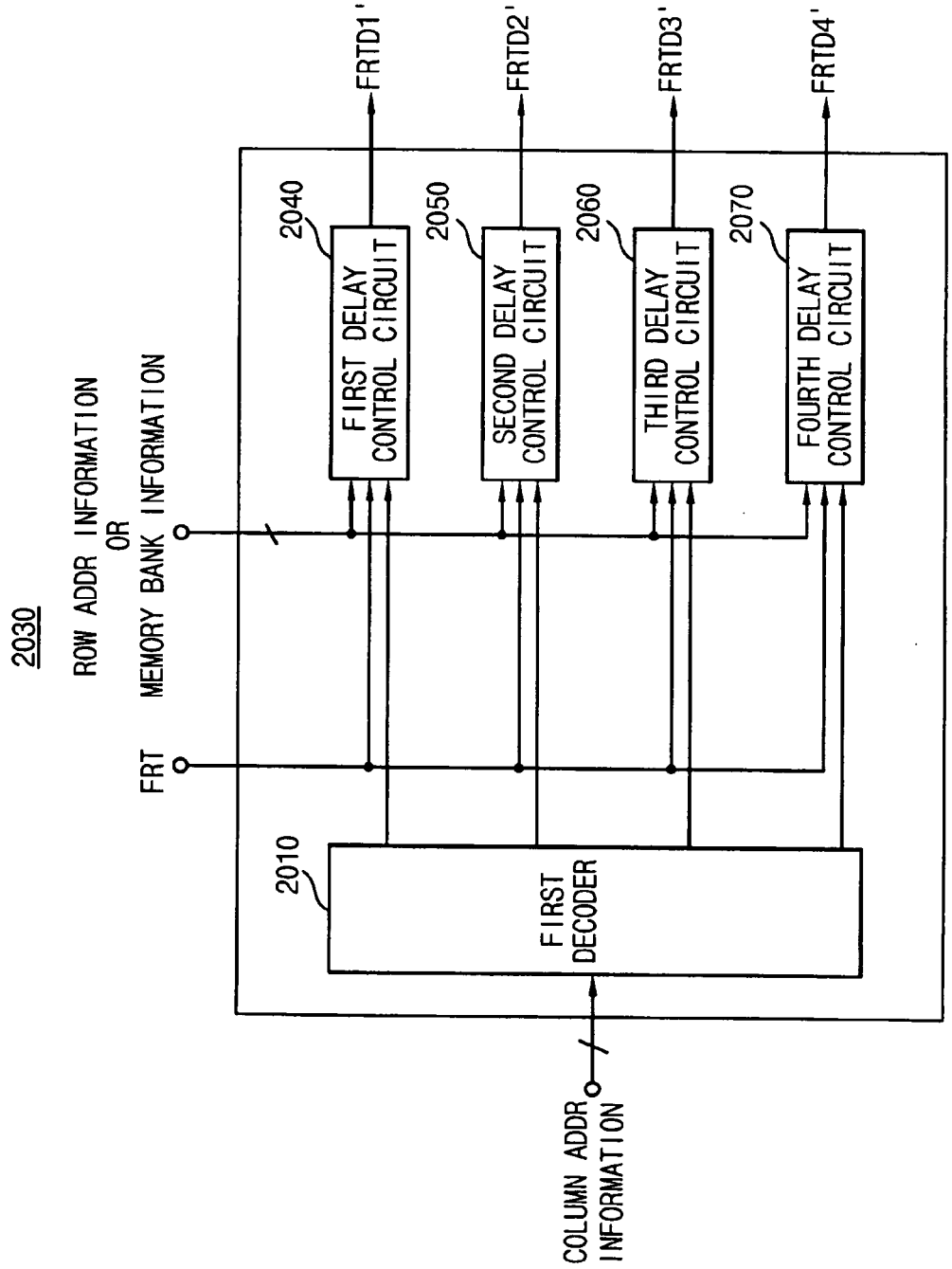
FIG. 21 is an example block diagram illustrating of a delay control circuit of FIG. 20.
Figure 22:
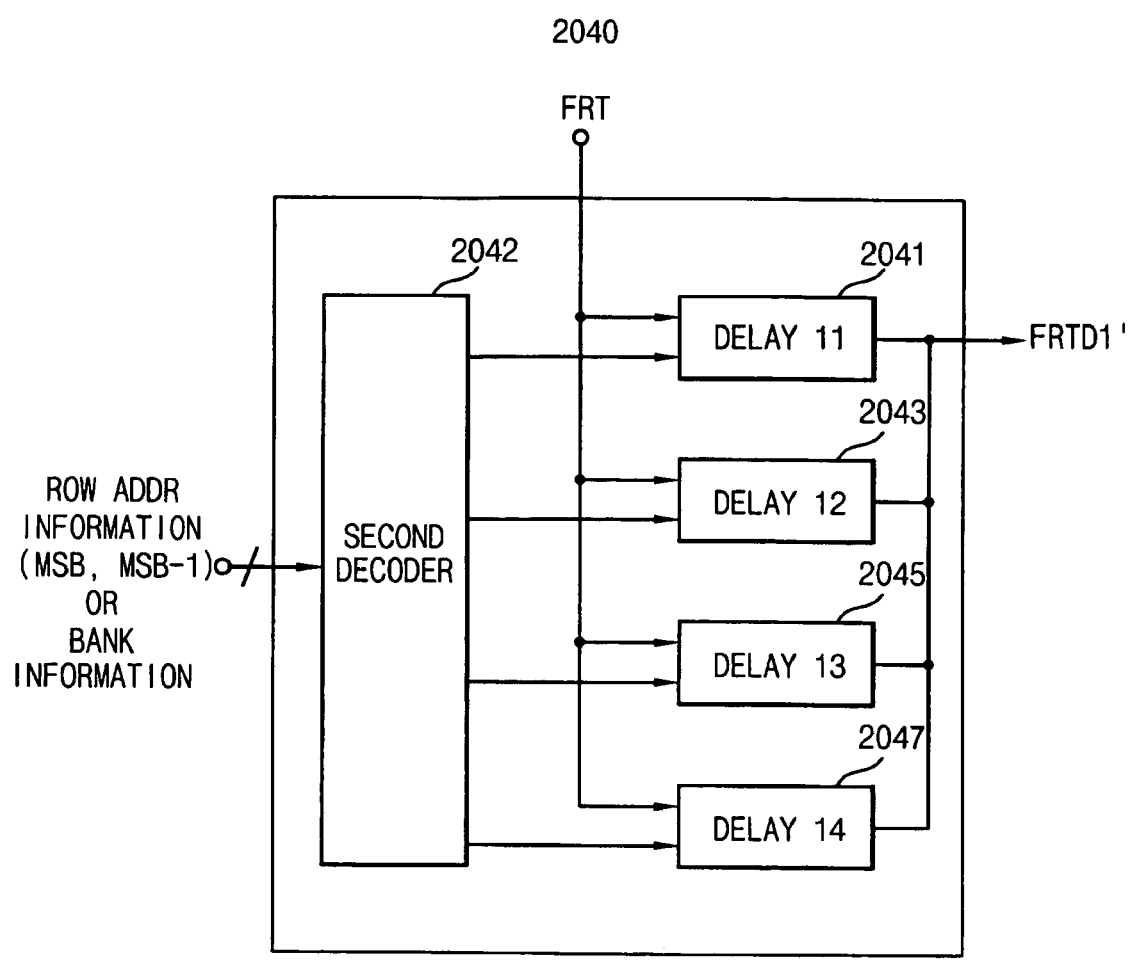
FIG. 22 is an example block diagram illustrating in detail an internal delay control circuit of FIG. 21.
Figure 23:
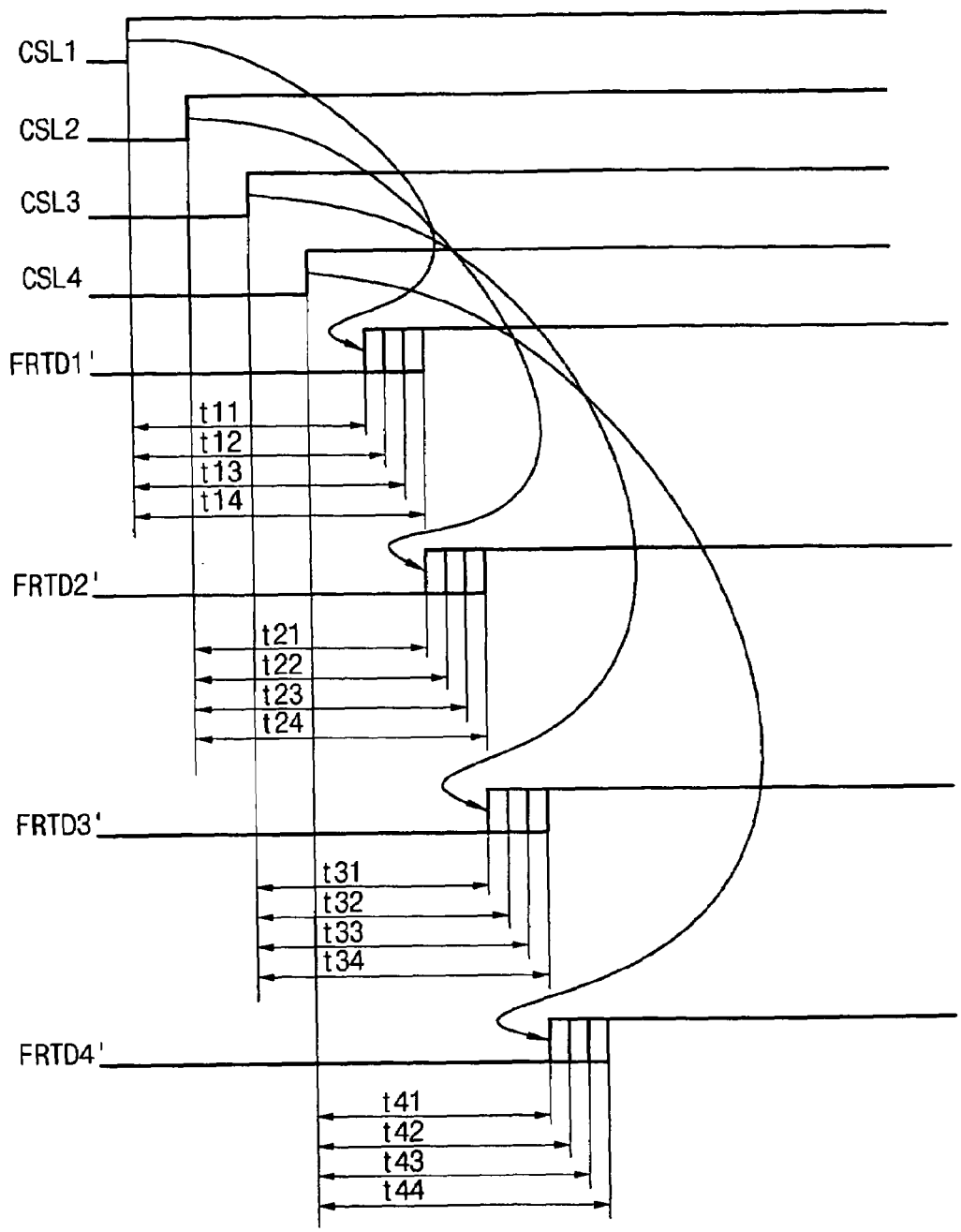
FIG. 23 is a timing diagram illustrating delay characteristics of the data sampling signal of FIG. 22.

FIG. 20 is a block diagram illustrating a memory device having a delay control circuit to control the delay of a data sampling signal (FRT) according to still another example embodiment of the present invention. FIG. 21 is an example block diagram illustrating in detail a delay control circuit of FIG. 20. FIG. 22 is an example block diagram illustrating an internal delay control circuit of FIG. 21. FIG. 23 is a timing diagram illustrating delay characteristics of the data sampling signal FRTD' of FIG. 22.

The example embodiment of FIG. 20 illustrates an example memory device having first through fourth memory blocks (or four memory banks) distanced from the input/output sense amplifier in a row direction. Each of the memory blocks (or memory banks) are divided into four sub memory blocks (not shown) arranged in increasing order of distance from the input/output sense amplifier in a column direction.

A delay control circuit 2030 receives a data sampling signal (FRT), row address information and column address information to generate a plurality of data sampling signals. The row address information may have a bit value corresponding to upper two bits (MSB and MSB-1) of the row address when dividing the memory device into four memory blocks in the row direction. Otherwise, the row address information may correspond to memory bank information having two bit data when dividing the memory device into four memory banks in the column direction.

The column address information, for example, may have a bit value corresponding to the most significant bit and the second most significant bit (MSB and MSB-1) of the column address 4 when the memory block (or memory bank) is divided into four sub memory blocks in the column direction. In addition, the column address information, for example, may correspond only to the most significant bit (MSB) of the column address when each of the memory blocks (or memory banks) is divided into two sub memory blocks in a column direction.

A decoder 2010 of the delay control circuit 2030 decodes the MSB and MSB-1 of the column address to enable one of first through fourth delay circuits 2040, 2050, 2060 and

2070. The configuration of the first delay control circuit 2040 is shown in FIG. 22 and the configuration of the second through fourth delay control circuit 2050, 2060, 2070 may be similar to that of the first delay control circuit 2040 in FIG. 22.

For example, when upper two bits (MSB and MSB-1) of a column address have a bit value "00," respectively, a first decoder 2010 enables a first delay control circuit 2040 to output a data sampling signal (FRTD1') delayed corresponding to a distance between the input/output sense amplifier and a first sub memory block that is nearest to the input/output sense amplifier.

The first delay control circuit 2040 includes first through fourth delay circuits 2041 (DELAY 11), 2043 (DELAY 12), 2045 (DELAY 13), and 2047 (DELAY 14) that are enabled by a second decoder 2042 based on the MSB and MSB-1 of the row address (or memory bank information). The first through fourth delay circuits 2041 (DELAY 11), 2043 (DELAY 12), 2045 (DELAY 13), and 2047 (DELAY 14) generate the data sampling signal (FRTD1') delayed by time periods t11, t12, t13, and t14 with respect to a first column selection signal CSL1 based on bit values "00," "01," "10," "11" of the MSB and MSB-1 of the row address, respectively, wherein the time periods t11, t12, t13 and t14 satisfy the relationship t14>t13>t12>t11. The delayed data sampling signal (FRTD1') is provided to a first input/output sense amplifier 2020.

Data provided from a first data input/output line (GIO21) are sampled by a first input/output sense amplifier 2020 in response to the input delayed data sampling signal (FRTD1'). The first data input/output line (GIO21) is connected to a first sub memory block (not shown) that is nearest to the input/output sense amplifier in the column direction through input/output lines.

When the upper two bits (MSB and MSB-1) of the column address have a bit value "01," respectively, the first decoder 2010 enables a second delay control circuit 2050 to output a data sampling signal (FRTD2') delayed corresponding to a distance between the input/output sense amplifier and the second sub memory block which is second nearest to the input/output sense amplifier.

Four delay circuits in the second delay control circuit 2050 generate the data sampling signal (FRTD2') delayed by time period t21, t22, t23, t24 with respect to a second column selection signal CSL2 corresponding to bit values "00," "01," "10," "11" of the MSB and MSB-1 of the row address (or memory bank information), respectively, wherein the time periods t21, t22, t23 and t24 satisfy the relationship t24>t23>t22>t21. The delayed data sampling signal (FRTD2') is provided to a second input/output sense amplifier 2022.

When the upper two bits (MSB and MSB-l) of the column address have a bit value "01," respectively, the first decoder 2010 enables a third delay control circuit 2060 to output a data sampling signal "FRTD3'" delayed corresponding to a distance between the input/output sense amplifier and the third sub memory block which is third nearest to the input/output sense amplifier.

The four delay circuits in the third delay control circuit 2050 generate the data sampling signal (FRTD3') delayed by time periods t31, t32, t33, t34 with respect to a third column selection signal (CSL3) corresponding to bit values "00," "01," "10," "11" of the MSB and MSB-1 of the row address (or memory bank information), respectively, wherein the time periods t31, t32, t33 and t34 satisfy the relationship t34>t33>t32>t31. The delayed data sampling signal (FRTD3') is provided to a third input/output sense amplifier 2024.

When the upper two bits (MSB and MSB-1) of the column address have a bit value "11", respectively, the first decoder 2010 enables a fourth delay control circuit 2070 to output a data sampling signal (FRTD4') delayed corresponding to a distance between the input/output sense amplifier and the fourth sub memory block located farthest from the input/output sense amplifier.

The four delay circuits in a fourth delay control circuit 2050 generate the data sampling signal (FRTD4') delayed by time periods of t41, t42, t43 and t44 with respect to a fourth column selection signal (CSL4) corresponding to bit values "00," "01," "10," "11" of the MSB and MSB-1 of the row address (or memory bank information), respectively, wherein the time periods t41, t42, t43 and t44 satisfy the relationship t44>t43>t42>t41. The delayed data sampling signal (FRTD4') is provided to a fourth input/output sense amplifier 2026.

The delay control circuit 2030 generates the data sampling signals (FRTD1') through (FRTD4') having predetermined time delays based on information concerning the physical distance between each of the memory blocks and the input/output sense amplifier both in the row direction and in the column direction.

Having thus described example embodiments of the present invention, it is to be understood that the invention defined by the appended claims is not to be limited by particular details set forth in the above description as many apparent variations thereof are possible without departing from the scope thereof as hereinafter claimed.

What is claimed is:

1. A semiconductor memory device, comprising:
   a plurality of memory units;
   a data input/output line to transmit data output from the plurality of memory units;
   an input/output sense amplifier configured to sense and amplify the data; and
   a delay control circuit adapted to delay a first data sampling signal by generating a second data sampling signal, the second data sampling signal generated based on distance information of each of the memory units with respect to the input/output sense amplifier and the first data sampling signal, wherein data from the plurality of memory units are sampled within an active period of the second data sampling signal.

2. The device of claim 1, wherein the delay control circuit includes a decoder to decode the distance information, and two delay circuits.

3. The device of claim 2, wherein the memory unit is two memory blocks, and the distance information includes a most significant bit (MSB) of a row address.

4. The device of claim 2, wherein the memory unit includes four memory blocks, the distance information includes a most significant bit (MSB) and a second most significant bit (MSB-1) of a row address, and the delay control circuit includes four delay circuits.

5. The device of claim 2, wherein the memory unit includes two memory banks, and the distance information includes memory bank information.

6. The device of claim 5, wherein each of the two memory banks includes two memory blocks, the distance information further includes a most significant bit (MSB) of a row address, and the delay control circuit includes four delay circuits.

7. The device of claim 5, wherein each of the two delay circuits is adapted to generate the second data sampling signal respectively having a different time delay.

8. The device of claim 2, wherein the memory unit includes four sub-memory blocks, the distance information includes a most significant bit (MSB) and a second most significant bit (MSB-1) of a column address, the delay control circuit includes four delay circuits, and wherein each of the four delay circuits is adapted to generate the second data sampling signal respectively having a different time delay.

9. The device of claim 1, wherein an amount of the delay increases as the distance between each of the memory unit and the input/output sense amplifier increases.

10. A semiconductor memory device, comprising:
a plurality of memory units;
a data input/output line to transmit data output from the plurality of memory units;
an input/output sense amplifier configured to sense and amplify the data; and
a delay control circuit adapted to delay a first data sampling signal by generating a second data sampling signal, the second data sampling signal generated based on a column address information and a row address information and the first data sampling signal, wherein data from the plurality of memory units are sampled within an active period of the second data sampling signal.

11. The semiconductor memory device of claim 10, wherein the column address information includes a most significant bit (MSB) and a second most significant bit (MSB-1) of a column address and the row address information includes a most significant bit (MSB) and a second most significant bit (MSB-1) of a row address.

12. The device of claim 10, wherein the delay control circuit includes four additional internal delay control circuits, each of the internal delay control circuits adapted to generate the second data sampling signal having a different time delay, and wherein each of the internal delay control circuits includes a second decoder, and four delay circuits.

13. A method of delaying a data sampling signal of a semiconductor memory device, comprising:

activating a column selection signal to select a memory cell from a plurality of memory units;
transmitting data of the selected memory cell through a data input/output line;
delaying a first data sampling signal by generating a second data sampling signal based on distance information between each of the memory units with respect to the input/output sense amplifier; and
sampling the data of the selected memory within an active period of the column selection signal and an active period of the second data sampling signal.

14. The method of claim 13, wherein the memory unit includes two memory blocks, and the distance information includes a most significant bit (MSB) of a row address.

15. The method of claim 13, wherein the memory unit includes four memory blocks, and the distance information includes a most significant bit (MSB) and a second most significant bit (MSB-1) of a row address.

16. The method of claim 13, wherein the memory unit includes two memory banks, and the distance information includes memory bank information.

17. The method of claim 13, wherein the memory unit includes two memory banks and each of the memory banks include two memory blocks, and the distance information further includes a most significant bit (MSB) of a row address.

18. The method of claim 13, wherein delaying a first data sampling signal is performed using two delay control circuits each of which is adapted to generate the second data sampling signal respectively having a different time delay.

19. The method of claim 13, wherein the memory unit includes four sub-memory blocks and the distance information includes a most significant bit (MSB) and a second most significant bit (MSB-1) of a column address.

20. The method of claim 13, wherein the memory unit includes four memory blocks, and the distance information includes a most significant bit (MSB) and a second most significant bit (MSB-1) of a column address and a most significant bit (MSB) and a second most significant bit (MSB-1) of a row address.

* * * * *